United States Patent
Hockaday (10) Patent No.: US 8,537,554 B1
(45) Date of Patent: Sep. 17, 2013

(54) STRUCTURED RELIEF DIELECTRIC HEAT SINK FOR PLANAR PHOTOVOLTAIC CELLS AND SEMICONDUCTOR DEVICES

(75) Inventor: Robert G. Hockaday, Los Alamos, NM (US)

(73) Assignee: Energy Related Devices, Inc., Tucumcari, NM (US)

( * ) Notice: Subject to any disclaimer, the term of this patent is extended or adjusted under 35 U.S.C. 154(b) by 284 days.

(21) Appl. No.: 12/800,537

(22) Filed: May 17, 2010

Related U.S. Application Data (60) Provisional application No. 61/216,381, filed on May 15, 2009.

(51) Int. Cl.
*H05K 7/20* (2006.01)

(52) U.S. Cl.
USPC ........... 361/713; 361/690; 361/710; 136/246; 174/526

(58) Field of Classification Search
USPC ......... 174/383–386, 520–531; 361/676–678, 361/679.46, 688–690, 707, 709, 710, 712–713, 361/728, 750
See application file for complete search history.

(56) References Cited

U.S. PATENT DOCUMENTS

| | | | |
|---|---|---|---|
| 4,461,922 A * | 7/1984 | Gay et al. ...................... | 136/249 |
| 4,818,337 A | 4/1989 | Barnett | |
| 4,834,578 A | 5/1989 | Bores | |
| 5,229,914 A | 7/1993 | Bailey | |
| 5,304,845 A | 4/1994 | Lindquist et al. | |
| 5,374,317 A | 12/1994 | Lamb et al. | |
| 5,482,568 A * | 1/1996 | Hockaday ...................... | 136/246 |
| 6,671,172 B2 | 12/2003 | Carter | |
| 6,803,514 B2 | 10/2004 | Takeyama | |
| 6,994,155 B2 | 2/2006 | Dessiatoun et al. | |
| 7,109,520 B2 | 9/2006 | Yu et al. | |
| 7,135,357 B2 | 11/2006 | Yu et al. | |
| 7,358,665 B2 | 4/2008 | Yu et al. | |
| 7,557,290 B2 | 7/2009 | Schripsema | |
| 2002/0096206 A1* | 7/2002 | Hamakawa et al. .......... | 136/244 |
| 2003/0056943 A1 | 3/2003 | Dessiatoun et al. | |
| 2003/0152766 A1* | 8/2003 | Vargo et al. .................. | 428/343 |
| 2004/0182432 A1 | 9/2004 | Yoda et al. | |
| 2005/0077601 A1 | 4/2005 | Yu et al. | |
| 2005/0077615 A1 | 4/2005 | Yu et al. | |
| 2005/0098878 A1 | 5/2005 | Yu et al. | |
| 2005/0121745 A1* | 6/2005 | Tu .................................. | 257/532 |
| 2005/0176174 A1* | 8/2005 | Leedy ........................... | 438/107 |
| 2005/0284515 A1 | 12/2005 | Stevens et al. | |
| 2007/0272295 A1 | 11/2007 | Rubin et al. | |

(Continued)

OTHER PUBLICATIONS

Ali Alfegi et al.; *The Effect of Flow Rates on the Performance of Finned Single Pass, Double Duct Photovoltaic Thermal Solar Air Heaters*; European Jour. of Scientific Research; vol. 25, No. 2 (2009); pp. 339-344.

*Primary Examiner* — Courtney Smith
(74) *Attorney, Agent, or Firm* — James Creighton Wray (57) ABSTRACT

Distribution and coupling of waste heat from planar non-concentration photovoltaic cells and semiconductor electrical devices is enhanced by forming dielectric relief structures and thermal conductive and emissive coatings on the cover and/or backing plate. The composite relief structures of layers, voids, and fins on the back surface mitigate the differential thermal expansion of dissimilar material and optimize convective heat transfer and radiant heat transfer with respect to costs. This leads to higher performance of the photovoltaic and semiconductor cells, a stronger and lighter backing plate components, and lower cost per watt for mounted devices.

25 Claims, 7 Drawing Sheets

(56) References Cited

U.S. PATENT DOCUMENTS

| | | |
|---|---|---|
| 2008/0048215 A1* | 2/2008 | Davies .................... 257/274 |
| 2008/0123313 A1 | 5/2008 | Horne et al. |
| 2008/0135090 A1 | 6/2008 | Corrales |
| 2008/0135092 A1 | 6/2008 | Corrales |
| 2008/0135094 A1 | 6/2008 | Corrales |
| 2009/0014056 A1* | 1/2009 | Hockaday .................... 136/247 |
| 2009/0056698 A1 | 3/2009 | Johnson et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |

* cited by examiner

STRUCTURED RELIEF DIELECTRIC HEAT SINK FOR PLANAR PHOTOVOLTAIC CELLS AND SEMICONDUCTOR DEVICES

This application clams the benefit of U.S. Provisional Application No. 61/216,381, filed May 15, 2009, which is hereby incorporated by reference in its entirety.

SUMMARY OF THE INVENTION

A typical non-concentrated crystalline photovoltaic panel will experience a rise in temperature of 46° C. in full sun and no wind. This translates to a 15% loss of power from the optimized electrical output of a crystalline silicon photovoltaic panel. In actual tests of panels, with constant electrical loads, the power loss has been as high as 20%. Thus, if photovoltaic panels could be kept cooler they would realize a power improvement. If this cooling improvement in the panel could be accomplished without raising the costs by 15% or removing 15% of the power output, a net cost improvement can be realized.

Typical non-concentrating photovoltaic cells are mounted and encapsulated onto dielectric plates, glass, or polymers on the outer surface and then encapsulated with glass, polymers, or another similar, low thermal expansion, and low thermal conductivity layer on the back side. This backing layer also provides the needed electrical insulation protection on the back side of the panel. The back surface of the panel may then be either covered with an uncoated sheet of aluminum or left uncoated and exposed to the air on the back side of the photovoltaic panel. These cells and panels become hot with exposure to sunlight. Photovoltaic cells are sensitive to temperature; for typical operations they lose 15% in efficiency as they heat up during the course of a day. The band gap energy of the semiconductor decreases slightly as the temperature rises, and the saturation current of minority carriers increases with increasing temperature. The net result is the typical peak power loss coefficients with temperature rise are:

Silicon (crystalline) 1.1 eV band gap, $-0.35\%/^\circ$ C. to $-0.44\%/^\circ$ C.

GaAs (crystalline) 1.35 eV band gap, $-0.23\%/^\circ$ C.

To remove heat from hot photovoltaic cells or semiconductor devices, in a similar planar arrangement to their surroundings, the heat must travel through the encapsulant and then transfer to the surrounding air (or fluid) as well as radiating from the surface of the encapsulant. This heat transfer is dependent upon the temperature gradient and inversely dependent upon the thermal conductivity, convection coefficient, and the emissivity of the encapsulant. The following are two examples of the costs and benefit/cost ratio estimated for a conventional solid metal heat sink and a composite dielectricimetal foil heat sink. Both of these system designs are effective in removing heat from the photovoltaic to recover 15% of the peak power capacity. The estimated benefit/cost ratio to the installed photovoltics system, comparing the material costs of these two heat sinks alone, is:

4.4→1.7 (solid aluminum metal heat sink mounted to crystalline silicon cells).

33→15.6 (composite folded sheet aluminum and ethylene-vinyl acetate dielectric relief structure).

The result is that the composite heat sink, the amount of materials used, is roughly one tenth that of the solid metal heat sink. The benefit/cost ratio is greater than one for both on a raw material cost basis. This indicates that both are beneficial economic additions to the photovoltaic system. The composite heat sink addition would be expected to achieve a payback to the customer within one to two years, while a solid metal heat sink would achieve a much slower payback of 7 to 15 years. The total system benefit would be a reduction in cost of 14.5% to 14.1% for the electricity produced from a crystalline silicon cell photovoltaic array using the composite heat sink. The solid metal heat sink would reduce the system produced electrical cost by 6% to 12%. Thus, heat sinking the photovoltaic arrays has a significant economic benefit to photovoltaic electrical power generation, and low cost composite heat sinks show the greatest cost benefit. It should be mentioned that reducing the peak temperatures of the photovoltaic panel is expected to have the additional benefit of increasing the longevity of the photovoltaic cells and has not been factored into this simple economic analysis.

To effectively mount the heat sinks to the photovoltaic panels without causing cell fracturing from differential thermal expansion stress, the mounting substrates for the photovoltaic or semiconductor devices must either match the coefficients of thermal expansion or have a stress relief mechanism. The maximum sheer stress imposed upon a planar cell is the product of the differential thermal expansion coefficient, temperature range, cell length, and the modulus of elasticity. Thus, reducing any one of these factors in the product can reduce the sheer stress. If silicon wafer photovoltaic cells are mounted rigidly to a solid aluminum heat sink, the thermal differential stress and operating temperature range will fracture the typical cells. The thermal expansion coefficients of these two materials are: Si: $25 \times 10^{-7}/^\circ$ C.; Al: $240 \times 10^{-7}/^\circ$ C. To correct this situation there are the following four solutions:

1. Mount the silicon cells or semiconductor devices on substrates that have a thermal expansion coefficient that matches that of the silicon, such the as glass. The thermal expansion coefficients of glasses are adjustable with additives to the glass. An example of matched\thermal expansion coefficients materials: Si: $25 \times 10^{-7}/^\circ$ C.; Kimax® KG-33 glass: $32 \times 10^{-7}/^\circ$ C. (Grey Glass, 217-44 98th Ave, Queens Village N.Y. 11429).

2. Use materials that have low modulus of elasticity such as silicone rubbers, foamed materials, and gels as a soft interface material. The larger the length of a single cell, or continuous contact, the thicker and or softer the interface material needs to be.

3. Shorten the parallel contact distance between the silicon cell and the heat sink material. The heat sink can have discontinuities, voids, and convolutions that can act as strain reliefs.

4. Reduce the temperature range experienced by the system. By heat sinking the photovoltaic panels, it reduces the peak temperature on the cells and heat sink interface.

All four of the complementary techniques reduce the thermal differential expansion effects and are implemented in this invention.

Two additional innovation benefits incorporated into forming a heat sink to the photovoltaic cells or semiconductor devices can be realized in this invention. The first benefit is that the heat sink relief structures can increase structural strength of the panels; the strength to weight ratio of the photovoltaic panels can be increased, and the metal dielectric lamination can toughen the panel against impact fracturing. The heat sink structure can be formed to be thin in the central regions to maximize heat transfer, while at the perimeter the heat sink structure is thickened to act as a frame to the panel. The second benefit is that the cover glass also can be formed as a dielectric with surface relief structures to act as an enhanced front surface heat sink, in addition to or with, the back of the panel heat sink. These relief features on the outer surface of the glass increase air (fluid) flow heat transfer acting as fins and/or creating turbulence, and mixing of the air flow over the surface. The following data shows the effectiveness of adding fins and blacking on the back surface of the photovoltaic panel.

For a black finned aluminum heat sink with AM 1 Sun the temperature in the plate is 33.6° C. With a black flat plate heat sink the temperature was 46.5° C. The air temperature was 18.7° C. with an approximately 5 mph wind speed and air pressure of 600 mm Hg and roughly 20% relative humidity. The heat sinks were angled at a 30° tilt from horizontal under a clear sky at 11:30 am Sep. 19, 2007. From this data the effective value of the convective heat transfer coefficient was:

62 $W/m^2C.°$ for a black finned surface and 5 mph wind
33 $W/m^2C.°$ for a black flat plate and 5 mph wind
20 $W/m^2C.°$ for typical solar panel tabulated in PV Engineering Handbook with 0 wind speed.

Figure 1:
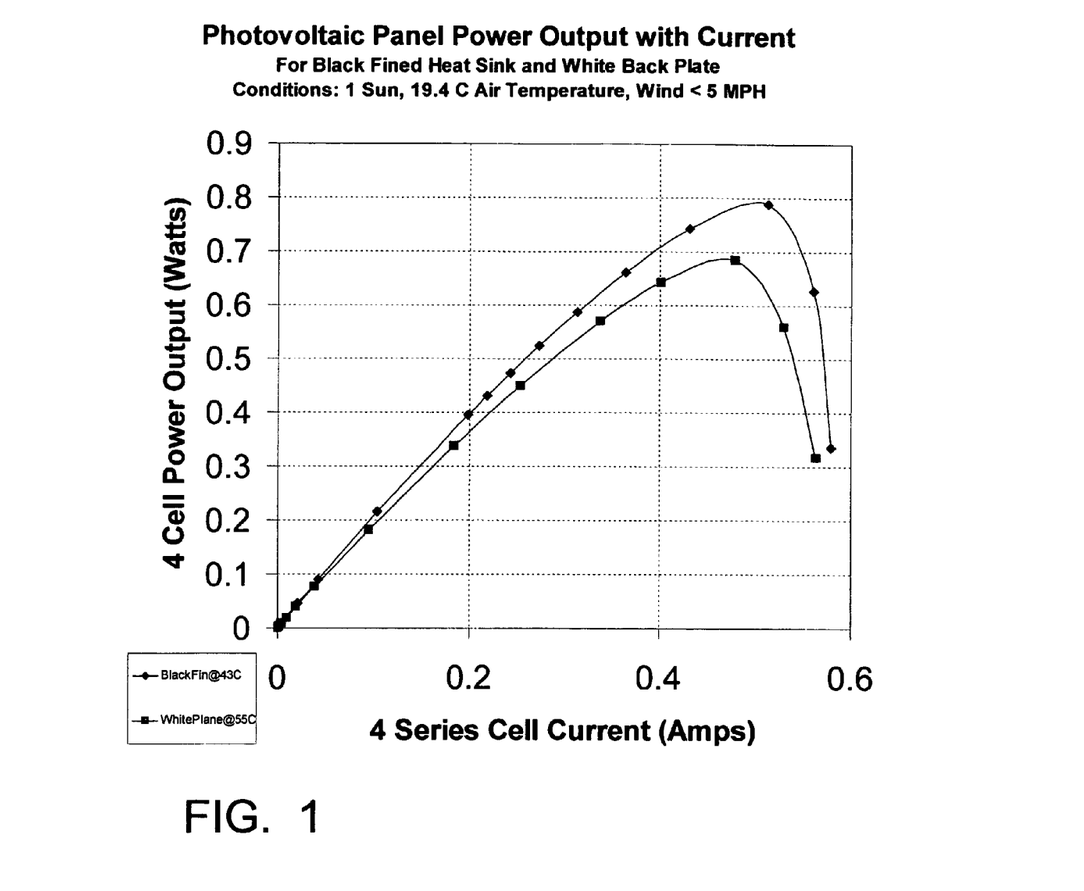
FIG. 1 shows power versus current output plot of a black finned and a white plane photovoltaic four cell panel.

An example of the performance of the panel with a white plastic backing plate and a blacked finned backing plate under 1 Sun and light breeze are shown in FIG. 1 the performance of the panel shows a 15% loss of power capacity at the peak power output.

It has been observed that high temperatures in photovoltaic cells can gradually degrade the cells by allowing dopants to migrate, and thus gradually degrade the performance of the cells. This degradation is typically exponentially dependent on the absolute operating temperature and the melting point of the semiconductor.

A straight forward solution to the overheating problem would be to thermally bond a metallic finned heat sink plate on the back plane of the photovoltaic cells. This is typically done in many solar concentrating systems, but the solid finned heat sinks are expensive due to the amount of expensive metal such as aluminum, used. Also, the thermal expansion coefficients as shown above between the semiconductor, glass, and aluminum are a significant mismatch. Typically what is done is to use a flexible and low modulus of elasticity (soft) encapusulant to form a stress relief zone between the components. This encapsulant stretches between the surfaces that are differentially expanding. In some systems the encapsulant is a viscous liquid or jelly and allows the components to slide. The larger the continuous length of the material of two surfaces in continuous contact, the greater the accumulated differential expansion stress, and the thicker the encapsulant needs to be to be able to stretch and not exceed its yield stress. The encapsulant is typically a poor thermal conductor and is expensive, so the thicker this layer is, the higher the temperature rise in the phototovoltaic cells and the more expensive the system.

This invention is to form a relief featured dielectric back plate and/or surface plate of non-concentrating planar photovoltaic panels with higher surface area features and high emissivity coatings to achieve higher, or more economical heat transfer from the back and/or front of the photovoltaic panel to the surrounding air and surfaces, by convection and radiant heat transfer, while mitigating differential thermal stress. By forming the dielectric relief layer with the surface facing the cells to be flat to allow mounting of the photovoltaic cell array and the outer surface having relief features, it will increase the heat transfer coefficient into the fluid surrounding the panel. If the back surface of the back panel is coated with high heat conductivity materials, the effective heat transfer through the panel to the entire outer surface can be increased. This coating effectively can give the dielectric relief features part of the thermal conductivity of solid metal heat sinks with only a small fraction of the use of expensive high thermal conductivity material. If the back side surface is coated with a material that has a high emissivity in the dominant spectrum of the operating temperature of the panel, the radiant heat transfer can be increased, and the photovoltaic panels can operate with higher power performance and lower material degradation.

By creating relief structures in the dielectric backing plate panel, several structural effects can be realized. The dielectric panel becomes stiffer with less material used. Thus, it can save on the amount of material used to provide a functional structural backing plate for the photovoltaic cells. Many photovoltaic cells, such as silicon and germanium semiconductors, are brittle and will fracture if bent. Thus, a rigid backing plate or mounting to the cover glass is needed to support and protect the cells from bending and impacts. The new backing panels are more cost effective by using less material to make the backing plate to achieve the needed stiffness, and the average thickness through the backing plate is less. These thinned regions reduce the thermal resistance through the backing plate. In this invention, periodic thinning of the dielectric backing plate or cover plate is used and can be combined with a high thermal conductivity coating, metal coating, or laminated metal plate on the surface of the relief structure to effectively increase the conductivity through the dielectric plate.

Heat is transferred through the thinned regions of the backing plate to the back surface thermally conductive layer, allowing the higher heat transfer through the thinned regions to spread laterally across the relief structures to transfer heat into the surroundings. Many photovoltaic cells, such as crystalline silicon, have high lateral thermal conductivities, thus, they can effectively spread heat to the cooler and higher thermal conductivity regions of the backing plate. This thermally conductive surface effectively gives the dielectric relief structure more of the thermal conductivity of the higher heat transfer material. This composite relief structure, with the dielectric interior and metal coating, can have the structural advantages in which the thick dielectric material is stiff and holds its rigid shape while the high heat transfer metal layer, if it were unsupported, would easily crumple when impacted. If the dielectric layer in the composite has the elastic properties of rubber or plastic, with a thin layer of metal, it has the structural advantage of elastically recovering from impacts.

The dielectric substrate of the heat sink has several other features in contrast to solid metallic heat sinks. In some situations the transparent nature of the dielectric can be useful over an opaque solid metal heat sink. Thin film transparent high thermal conductivity films can be coated on the dielectric relief structure. Finer scale structures can be molded and formed in the dielectric materials, such as high aspect ratio fins and twisted fins, and then the metal layer or high heat transfer material can be coated over the structure to achieve a high conduction and convective heat transfer. A unique feature in this invention is that the heat transfer fins can be formed into shapes that can impel flow over these surfaces to mix or form vortices. Examples of these shapes are twisted fins, sand-dune like fin shapes (barchans), crescents and ellipses, all of which cause flow surface separation and flow mixing and subsequently higher heat transfer rates.

A critical feature of this invention is that the dielectric substrate needs to have a coefficient of thermal expansion that matches the thermal coefficient of expansion of the semiconductor photovoltaic cells or needs to have a structure that mitigates the differential expansion effects. Otherwise, as temperatures rise and fall in the panel, the difference in thermal expansion can lead to the stressing and cracking of the semiconductor cells, or pulling the electrical contacts off the cells. This is a typical problem in using solid metal heat sink backings coupled to semiconductors. In this invention the high heat transfer layer, such as a metal foil, is added to the relief structure of the dielectric. This metal foil or, coating layer, because of its convoluted shape, will not be able to build up a high shear stress to the dielectric material, and in some situations, it may be practical to form the metal layer of folded or wrinkled metal. A new concept is to form the metal surface and the dielectric into an elastic polymorphic surface that simply does not allow stress to build up in any single direction across its surface. This surface can be characterized as not having a straight line on the surface of material in any direction through itself. This new heat sink invention can achieve high heat transfer rates and low material costs, but the new heat sink does not allow the high thermal coefficient of expansion typical of metal to transfer differential thermal expansion into the dielectric substrate and the photovoltaic cells.

Materials such as glass can be made structurally stronger if the surface of the glass is textured, compared to flat surface glass. The explanation is that these materials typically fail by fracturing, and fracture failure occurs by crack propagation. Thus, if a surface has a relief structure rather than a smooth surface, it will cause the stress of the crack direction to change at each relief structure and act to hold, slow, stop or interrupt the crack propagation. The glass back surface and/or glass front cover outer surface can have relief structures in them to make them stronger and improve their convective heat transfer.

From my research, coating the back surface black could increase the heat dissipation and lower the panel temperatures and thereby improve the power output by 5%. On the outer surface of the heat sink a high emissivity coating is placed. This coating typically will be a blackening coating of carbon black, which in the visible spectrum is black. It is feasible to have coatings that are effective in having a high emissivity in the majority of the spectrum that the heat sink needs to radiate (infrared for photovoltaic arrays) but may be transparent or have a desirable color or appearance in the visible spectrum. It is possible to color tint the back of the panel in the visible light spectrum without a significant loss of effective infrared emissivity. This may also reduce a small amount of visible light absorption from the back side and subsequent heating. Examples of this coating are titanium dioxide and water retaining coatings that have high infrared emission bands but low visible emissivity. The back surface of the photovoltaic panels can have a coating or be in contact with a phase change material that, at elevated temperatures absorbs heat. The blackening coating could incorporate this phase change material. Examples include waxes and salts that can phase change to absorb heat. Examples of water absorbing films are titanium oxide, zeolites, and acrylic polymers that can retain water when cool and evaporate water when heated, thereby reducing the peak temperature of the heat sink surface.

A specific example of this invention is to form a photovoltaic cell backing plate with glass with ridges, coat the glass with an aluminum foil, and a carbon black and titanium oxide blacking coating.

While it is well known, in the art, that photovoltaic cells are sensitive to temperature rise, finned heat sinking of non-concentrator photovoltaic panels has not been incorporated in commercial panels. The use of heat sink, non-concentrating, large planar photovoltaic cells has not been used in the current photovoltatic industry to date because the increased cost of using a conventional solid metal heat sink can not return a commensurate improvement in performance. I have found that a power output improvement of 5% to 15% could be realized by adding a heat sink to a non-concentrating photovoltaic panel. If a typical solid metal finned heat sink were placed on the back side of the photovoltaic array, the costs could increase more than 15%. Thus, the amount and cost of aluminum used in conventional heat sinks is not cost effective for this low intensity heat transfer application. Although I discovered that in the production of low cost rolled relief structured glass, the costs are no more or even less than flat glass to produce, and the relief features can make the panels stiffer and stronger. By only using a thin coating or laminated foil of the higher cost and heat transfer material, such as aluminum foil on the relief structure of the dielectric, it would cost much less than a solid metal heat sink. The painting of the back surface of the metal foil with a high emissivity coating such as carbon black loaded paint improved the power performance by roughly 5%. Thus, the use of this invention leads to better heat dissipation, a matching thermal coefficient substrate, a stiff effective backing, reduction in cost, and improvement in the efficiency of the cells mounted to it.

REFERENCES

Barnett Allen U.S. Pat. No. 4,818,337 "Thin Active-Layer Solar Cell with Multiple Internal Reflections". Issued: Apr. 4, 1989, Filed: Apr. 11, 1986. This patent is an example of texturing used in silicon photovoltaic cell to achieve improved light coupling and light trapping with multiple reflections of light in the cells. This patent does not describe using this structuring to remove heat from the backside of the photovoltaic panel, or for heat removal in general.

Hockaday US patent Application, Elastic contacts, describes a photovoltaic panel made with a plurality of lens and/or mirrors and light concentration to the granular cells, the dielectric of the lens in front of the cells, and the dielectric behind the cells and be shaped into a relief structure. The back surface heat sink surface is formed with metals and high emissivity. Hockaday describes heat relief structures with granular cells and light conduits, but not with planar cells. He does mention phase change material on the backside and infrared emitting coatings and fluid flow circulation past the cells is described.

Lamb, Walter et al. U.S. Pat. No. 5,374,317 "Multiple Reflector Concentrator Solar Electric Power System" Issued: Dec. 20, 1994, Filed: Mar. 23, 1993. This patent is an example of a larger scale light concentrator photovoltaic cell system. The patent describes Cassigranian optics and active and passive cooling schemes to cool the photovoltaic cells. The patent describes the effect of temperature rise causing a reduction in cell performance and the value of heat dissipation component. Electrical wires are used to transmit the electricity from the photovoltaic cells. In claim 6 the system is constructed in a modular construction to accommodate the thermal expansion and contraction of the photovoltaic component. This patent appears to use wires or sliding electrical contact to maintain electrical contact with expanding and contracting photovoltaic components. This patent does not describe using voids with non-sliding contact to mitigate differential thermal expansion. The photovoltaic cells are assembled in an array and then attached to the heat dissipation component. This patent does not describe or anticipate the use of the heat dissipation element in a non-concentrated photovoltaic array. In this patent heat dissipation elements of coatings, water absorption or evaporation from coatings, or selective emissivity are not mentioned.

Yoda Hiroyuki, et al. US Patent Application 20040182432 "Photovoltaic Module Subassembly and Photovoltaic Module with Sealed Insulating Glass" Filed: Feb. 19, 2004. This patent described lamination assemblies of discreet photovoltaic cells of plastics, rubber, and glass. This patent teaches how to thermally insulate the photovoltaic cell and accommodate thermal expansion of components with rubber interfaces. This patent teaches how to thermally insulate the photovoltaic cells. This patent does not teach efficient heat removal.

Stevens et al. US Patent Application 20050284515 "Light Receiving or Emitting Semiconductor Apparatus" Filed: Jun. 6, 2005. Metal backed glass laminated solar cell module is described. A corrugated backing is described. Using the corrugated surface and metal backing for mechanical stiffening and air flow cooling is described. This patent does not mention blacking or using voids to achieve strain relief. This patent does not mention differential thermal expansion.

Yu et al. U.S. Pat. No. 7,358,665 Roughed Spaced apart. Yu teaches increased heat transfer with a roughed surface coating that partially extends. Yu mentions many possible thermal conductors including rubbers, plastics, metals, metal oxides, electrical insulators, fiber glass+resins, aluminum oxide, glass, low melting point metals; tin, indium and lead, epoxy, and silicone bonding: metal loaded materials. Yu understands the importance of keeping the high thermal resistance materials thin to achieve high thermal heat transfer coefficients, radiant cooling, and black spray painting surfaces, irregular patterns, glass and organic films for support. Yu describes forming heat sinks with electrical conductors and electrically insulating materials formed in layers. Yu has diagrams of the heat sink showing vertical relief structure of the heat sinks and discrete separated fin structures. Yu does not mention thermal coefficient of expansion and the need to match or provide strain relief between the heat sink materials and semiconductors mounted on glass. Yu does describe forming separated heat sink "mesas". Yu describes "An aluminum metal sheet with a patterned surface is attached to the epoxy/glass layer with thermal conductive paste (made with organic silicone which is electrically insulating)". He does not describe forming continuous heat sinks or plates with differential strain relief patterns, voids, or relief structures. Yu does not describe interpenetrating layers in a relief pattern to achieve strain relief in the heat sink. Yu does not describe forming the strain relief structures or voids in the assembly process of gluing of relief cavities in a sheet metal. Yu does not describe incorporating phase change materials into the radiant coating. Yu does not describe the heat sink as being transparent to light, although several of the materials as suitable for heat sinks mentioned are transparent to light such as silicon dioxide. Yu describes the heat sink as protection for the semiconductor devices, but not describe forming thickened perimeters of the heat sink to act as a framing structure. Yu does not describe the heat sink as being the substrate for the semiconductor devices.

Yu et. al U.S. Pat. No. 7,135,357 Roughened Spaced apart with metal heat sink. patterned insulating layer. Spaced apart members thermally coupled to electrically conductive members. Does not mention substrate or form of substrate. Organic LEDs very sensitive to temperature and degrade quickly at elevated temperatures. Mentions that the lifetime of particular OLEDs poly(phenylenevinylene) yellow and orange colors have operational lifetimes 35 times less at 80° C. than at 25° C. This patent describes using an insulating stencil mask over the substrate to form spaced apart members which are metal plated deposits. This patent does not describe the spaced apart members as being electrical insulators with metal coatings over them to form the spaced apart members.

Yu et al. U.S. Pat. No. 7,109,520 Heat sink with pattern extending part way though and out to outer surface. The heat sink pattern is black. No mention of combining metal and dielectric.

Dessiantoun U.S. Pat. No. 6,994,155 Heat channels with fins to form the heat transfer unit. Capillary wicking of liquid through the fiber fins and evaporative cooling is described. This patent application does not teach forming voids to relieve thermal differential expansion within the heat sink.

Takeyama U.S. Pat. No. 6,803,514 Mounting on substrate metal heat sink with electrical insulating joining material, electrical insulating, and radiating means. Takeyama does not mention convoluting or forming relief structures with the electrical insulator.

Dessiatoun 20030056943 Heat transfer (with fiber heat sink). Carbon fiber heat sinks are described. Capillary wicking through the fibers and evaporative cooling off the fins is described. This patent application does not teach forming voids to relieve thermal differential expansion within the heat sink.

Yu 20050077601 Roughened and blackened patterned electrically conductive pattern member.

Yu 20050077615 Heat sink having a pattern partially into heat sink.

Yu 20050098878 Roughened surface and black

Johnson 20090056786 Heat sink with fins on base plate. Serpentine bend of metal. Electrically insulating layer covers at least a portion of base metal plate.

Base plate and protective layer have thermal expansion coefficient differences. Conformal insulating layer uses reflectors and in essence, concentration. Describes using serpentine bending of sheet metal for fins in the heat sink. Described the sheet metal being brazed to the base metal plate. Mentions expansion joints. Flexible foil base plate. Does not describe forming the metal fins with a dielectric backing or dielectric relief structure. The conformal insulation covers the planar base metal plate. Johnson mentions differential thermal expansion problems between the base metal plate and the protective plate, and the need to fill them with an elastic material. He describes having a thermal expansion gap between the protective glass cover and the base plate, and sealing with silicone or optically transmissive and compliant material. Johnson does not describe voids in the base plate or between the cell and the base plate to act as thermal expansion relief.

Johnson 20090056787, 20090056785, 20090056698 same information and 20090056786.

Horne 20080123313 Semiconductor planar mount on flexible dielectric. Uses heat spreaders and solder mounting to flexible dielectric. Does not mention non-planar relief structured electrical insulator.

Corrales 2008135094, 20080135092, 20080135090, this patent application describes composite polymer/metal heat sinks. Describes a range of fin shapes including herringbone, undulating, pyramids, and frustrum pyramids. This patent describes breaks in the fin patterns to enhance convective air flow, but does not describe mixing, twisted, or "dune shaped" fins. Corrales, describes using cavities in the heat sink to achieve vacuum clamping to the photovoltaic panel in the gluing operation and evacuation to remove pockets of air during lamination: "removing trapped air may allow a more intimate contact between layers resulting in increased thermal transfer". This patent teaches against leaving bubbles and voids in the interface between the heat sink and the photovoltaic cells. This patent does mention matching or choosing similar thermal expansion coefficient material polymers for the heat sinks and to interface with the photovoltaic cells. This patent describes forming heat sinks that are composites of polymers and metals, and folded sheet metal fins. This patent describes forming surface tiles that can act as frames. This patent does not teach forming voids to relieve thermal differential expansion, or mention that the heat sink could be formed as the frame to the photovoltaic cells.

Rubin 20070272295 this patent application describes heat sinks that allow for thermal expansion by allowing the heat dissipating apparatus to move relative to each other. This patent does not teach forming voids to relieve thermal differential expansion within a single heat sink.

Lindquist U.S. Pat. No. 5,304,845 Inverted V shaped fins on heat sink for cooling integrated circuits. This is an example of several patents that described forming vortices in the flow off the fins. None of these patents describe forming voids in the fins.

Bailey U.S. Pat. No. 5,229,914 Describes forming vortices in flow over a heat sink with curved or bent fins. This is a second example of patents that describe forming vortex flow from fins. None of these patents describe forming voids in the fins.

Carter U.S. Pat. No. 6,671,172 is an example of several patents that describe curved fins for enhanced heat transfer for a heat sink. There is no mention voids in the fins or of dune-like or barchan-like fins.

Bores U.S. Pat. No. 4,834,578 is the only patent that uses the word barchans and it is used in the context of dykes and jetties.

There are no US patents or US patent applications that used the words "barchan" and "fin" or "heat sink" together in their text.

Mohd, Yusof, et al. "Hybrid Photovoltaic-Thermal (PV/) Solar Air Heating System" European Journal of Scientific Research ISSN 1450-216X Vol. 25 No. 2 2009, pg. 339-344. Mono-crystalline silicon photovoltaic cells are pasted to an absorber plate with fins attached to the other side. The effect of flow rates for single pass and double pass ducted air flow over fins on photovoltaic cells and heat delivery are studied. Their conclusions: Fins were shown to be important as an integral part of the absorber surface. This paper does not describe the fins as being a composite of a dielectric and metal relief surface from the absorber plate. The fins were made of homogenous metal that were glued to the absorber plate. This article does not teach forming voids to relieve thermal differential expansion within a single heat sink These and further and other objects and features of the invention are apparent in the disclosure, which includes the above and ongoing specification, with the claims and the drawings.

BRIEF DESCRIPTION OF THE DRAWINGS

FIG. 2 is a cross-section and projected view of backing plate and fins. Elements are:
1. Planar surface of the dielectric plate
2. Relief structured dielectric material
3. High thermal conductive material layer
4. Radiant emissive layer
5. Trough between fins
6. Fin
7. Stress relief void in metal layer
8. Stress relief wrinkle of metal layer
9. Stress relief void in fin
FIG. 4B is a cross-sectional cut through the interconnected fin pattern matrix. Elements are:
30. Fin ridge crest
31. Relief structured dielectric
32. Thermal conductor layer
33. Radiant emissive layer or coating
34. Surface of the relief structured dielectric.
35. Stress relief void in the dielectric layer
FIG. 5B is a side cross-sectional view of the mixing fin surface heat sink. Elements are:
48. Dune-fin
49. Concave surface of dune-fin
50. Fluid flow rising and separating from dune fin.
51. Fluid flow descending and replacing flow under separated flow
52. Dielectric surface
53. Relief structure of dielectric
54. Thermal conductors of relief structure
55. Radiant emissive layer
56. Stress relief void in dielectric layer

DETAILED DESCRIPTION OF THE DRAWINGS

Several typical embodiments of the invention are illustrated in the following. In these drawings several variations in assembly and arrangements will be shown.

FIG. 1 shows differences of electrical output in watts and amps between photovoltaic panels under the same ambient conditions. The higher curve represents a panel with a black finned heat plate. The lower curve represents a panel with a white planar back plate.

Figure 2:
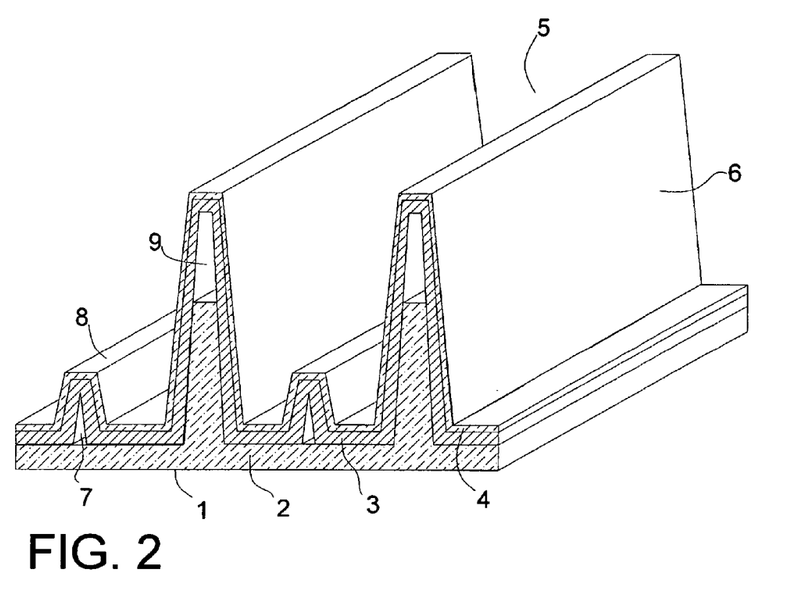

In FIG. 2 the finned heat sink is shown with planar surface 1 formed out of the dielectric material 2, such as glass. The dielectric material 2 such as glass, is extruded into a finned surface 6 and troughs 5. The relief structure 2, 6 in this example, is shown with aspect ratios of 3:1. The relief structure 6 fin heights taper, and width, can vary to optimize the strength, manufacturability, cost, and heat transfer. An aluminum metal layer or thermal conductive layer 3 is deposited as a plasma spray or foil lamination to adhere to the surface of the figured glass 2 to a thickness of 0.15 mm. Voids 7, 9 are formed between the metal layer and the dielectric to act as thermal differential expansion relief between the glass and the aluminum layer. Wrinkles 8 of the metal foil over the voids 7, can act as heat transfer fins while they also act to relieve differential expansion stress. A carbon black loaded paint 4 is coated over the thermal conductive layer 2 to a thickness of 0.01 mm. In operation planar photovoltaic cells are bonded to the planar surface 1 with glues or encapsulants such as Sylgard® 184 (Silicone Optical coupling adhesive Dow Corning, Dow Corning Corporation, Auburn Plant, 5300 11 Mile Road, Auburn Mich. 48611 USA) or Ethylene-vinyl acetate ((EVA) Elvax® DuPont Corporation, Wilmington, Del. 19880). The heat sink surface 6 has an air or fluid flow and shadowed region on the back side of the photovoltaic panel to conduct heat from the photovoltaic cells through the dielectric material 2, laterally through the conductive film 3, and then through the radiant emissive coating 4. The heat is removed through the radiant emissive coating 4 by radiation, conduction, and convection into the surrounding air or liquid flowing over the fins 6 and troughs 5.

Figure 3:
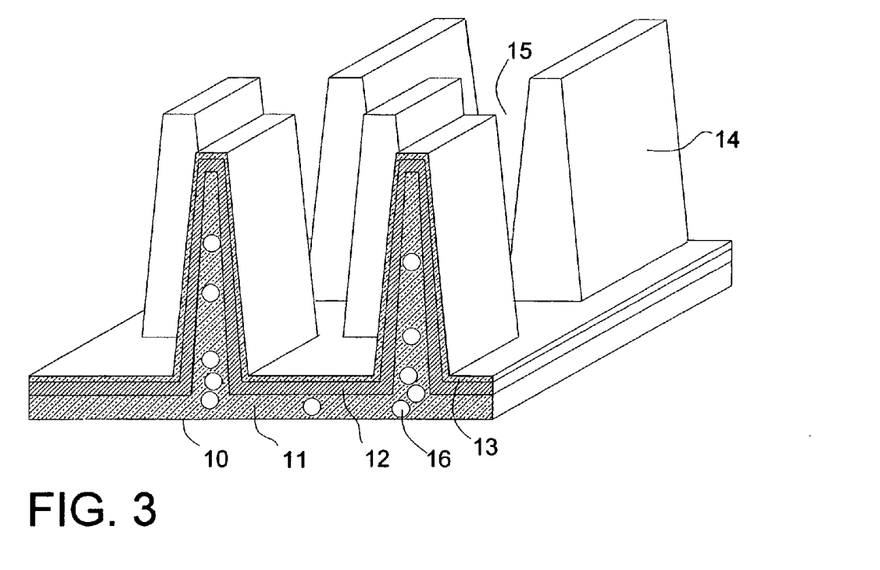
FIG. 3 is a cross-section and projected view of the relief structured dielectric backing plate with segmented and separated fins. Elements are:
10. Dielectric surface
11. Structured dielectric material
12. Thermal conductive coating or layer
13. Radiant emissive coating or layer
14. Fins
15. Gaps between fins
16. Voids in the dielectric material

In FIG. 3 the finned heat sink with flow gaps 15 and separated fins 14, is shown. In this example of the invention, the fins relief structure 14 are formed by molding the dielectric material 11 such as glass or polyester plastic. The front surface 10 is flat, and a variety of fin patterns can be created with the molding process, such as rectangular pyramidal fins 14 on the back surface. Other possible fin 14 shapes could be curved, rods, cones, polymorphic projections, and coils. Within the fin base 14 and the dielectric layer 11, voids are placed to act a differential thermal expansion strain relief. These voids 16 can be formed by patterning the dielectric deposits when it is molded, or injecting bubbles into the dielectric material 11 when it is being molded. A higher thermal conductive film 12 of plasma sprayed aluminum or metal loaded or graphite loaded ink, silicon carbide loaded ink, or alumina loaded ink is deposited onto the surface of the relief structure. A carbon black loaded paint 13 is then sprayed onto the surface of the higher thermal conductive film 12. Other types of radiant coatings 13 can incorporate materials that have low visible and short wavelength emissivity, but have high long wavelength emissivity. Thus, the back surface 13,14 could reject direct reflected visible light while still emitting in the infrared to minimize heat gain and maximize the panel's cooling performance. Examples of these types of materials are water absorbing materials such as zeolites, titanium dioxide, and hydro gels. Water has strong emission bands in the infrared, thus emitting better in the infrared. By absorbing water the materials can evaporate the water when the fins 14 become hot and absorb heat energy, cooling the panel. This can further lower the maximum temperature rise that the photovoltaic panel can experience in a day cycle. An expected cycle of operation is that the water absorbing film on the back side of the heat radiator can absorb water during the night, such as dew condensing on this radiantly cooled surface. Then, in the daytime as the panel heats it releases the heat into the phase change of the melting and evaporating water. Other types of phase change materials are possible, such as solid-liquid waxes, and hydrating salts. The incorporation of the water losing materials into the radiant emissive layer also will form voids in the coating when dry, which can provide thermal stress relief voids in the emissive layer and increase the heat transfer surface area. The panels could be incorporated into air heating systems or thermal energy storage systems.

Figure 4A:
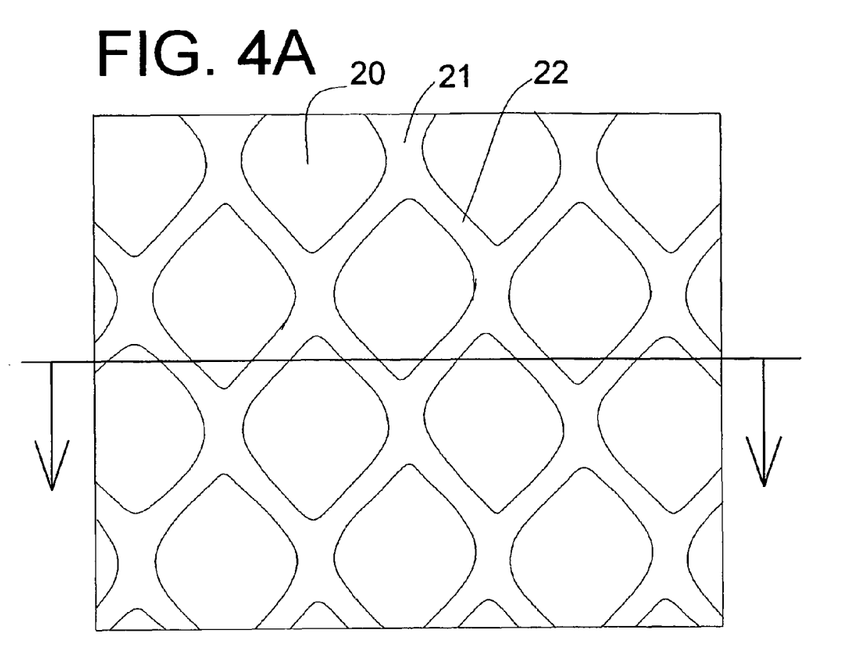
FIG. 4A shows an interconnected fin pattern matrix. Elements are:
20. Trough region
21. Fin interconnect region
22. Fin

In FIG. 4A an arrangement of interconnected fins 22 is shown. A wide variety of fins 22, protrusions, dimples, and polymorphic surfaces can be formed into the relief structure of the heat sink back surface 20. These relief structures 20, 21, 22 can have multiple purposes including increasing the heat transfer into the surrounding fluid, structurally stiffening the photovoltaic panel, and ease in assembly. In this particular interconnecting fin pattern, interconnecting ridges 21 are shown. When in operation air will flow across, into and out of the ridge pattern. These ridges 21, 22 may vary in height and shape and pattern to allow air flow and air mixing.

Figure 4B:
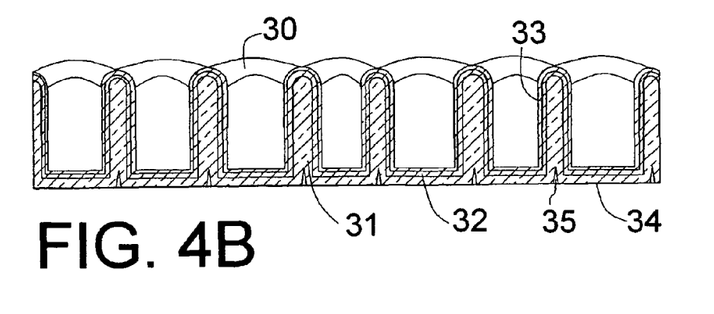

This interconnected fin matrix 21, 22 can be formed by a variety of techniques. One method is to use a stamp and dye to bend the sheet of aluminum or steel into the form of the relief structure. The outer surface of the formed sheet metal relief structure 20, 21, 22 is coated with black paint. In FIG. 4B a cross-sectional side view of the fin matrix. The interior surface of the relief structure metal sheet in the flat regions is coated in pattern with un-cured adhesive 31, such as silicone rubber sealant, Silicone rubber sealant adhesive (Dow Corning, Dow Corning Corporation, Auburn Plant, 5300 11 Mile Road, Auburn Mich. 48611 USA), urethane two component adhesive (H.B. Fuller Co. 1200 Willow Lake Blvd. PO Box 64683, St. Paul, Minn. 551640683), and then pressing the adhesive coated formed sheet metal onto the back dielectric backing of the photovoltaic panel 34. During this pressing process the adhesive can flow toward the cavities of the bent sheet metal 32, but not completely fill the fins 30, 31, to form voids 35 within the relief dielectric structure 31 of the heat sink. This flowing of adhesive into the nearby cavities allows the adhesive to thin out in the flat regions of the heat sink, and minimize the thickness of dielectric between the semiconductor devices and the thermally conductive layer 32 of the heat sink, and thereby maximizing the heat transfer rates to the thermally conductive layer. While the voids 35 in the base of the fins provide for differential thermal expansion strain relief between the heat sink and the semiconductor devices. Clamping or weighing down accordingly while the adhesive is cured to keep the relief metal sheet pressed against the photovoltaic panel. Other possible adhesives are contact adhesives, and thermal adhesives. These adhesives would use similar appropriate mounting techniques to bond the relief structured metal sheet to the back of the photovoltaic cell panels but could reduce the bonding time. The thickness of the resulting dielectric film 31 and voids 35 between the photovoltaic cells surface 34 can be adjusted by the volume and pattern of adhesive applied. Functional considerations and choice of adhesives depend how the photovoltaic cells are mounted on the front glass sheet or if the panel already has a dielectric backing material behind the photovoltaic cells. Many crystalline silicon photovoltaic cells have a plastic dielectric encapsulant on the back surface, so the adhesive will be selected to achieve a tight and enduring bond to this encapsulant. In some cases the same formulation of plastic encapsulant can be used to form the dielectric relief structure of the heat sink.

A second method of forming the relief backing panel is to mold a dielectric relief structure 31 out of a material such as silicone rubber, or EVA onto the back surface 34 of the photovoltaic panel. These adhesives may be loaded with thermally conductive additives, such as aluminum particles, silicon carbide, zirconium oxide, or graphite. Next plasma spray or vacuum deposit thermally conductive materials 32 such as aluminum, tin, carbon, diamond, silicon carbide, aluminum oxide, copper, zinc oxide, or zinc, over the dielectric relief structure 31. Another method of forming the thermally conductive layer 32 is to spray or ink jet print paint formed with metal particle or fiber loaded suspension in a polymer or solvent. Subsequently the paint is dried and heat cured, resulting in a thermally conductive metal film 32 by removing the solvents, or some of or all of the polymers, and conglomerating or fusing the metal particles to each other. A radiant emissive coating 33 such as carbon black loaded polymer paint is then coated over the thermally conductive layer.

A third method of forming the heat sink is by molding the glass, rubber, or polymer plastic 31 into a interconnected fin relief network 30. Next, deposit a thermally conductive coating 32 over the relief network and deposit a radiant emissive coating 33 over the thermal conductive coating. This heat sink assembly is then attached to the back surface 34, front, or both front and back surface of the photovoltaic panel. There are some applications where a heat sink on the front and back of the photovoltaic panel can be effective along with the possibility that the relief dielectric, thermal conductive coating, and emissive coating could be transparent. The photovoltaic panel or semiconductor device could receive light from both sides of the panel. In some situations the thermal conductivity and radiant emissivity of the relief dielectric material may realize sufficient convective and radiant performance not to need a separate thermal conductive material layer 32 or radiant emissive material layer 33. If these heat sink layers are being used to directly contact the photovoltaic cells and circuitry. The heat sink needs to be an electrical insulator 31 to avoid shorting the cells or preventing electrical contact outside the panel.

Figure 5A:
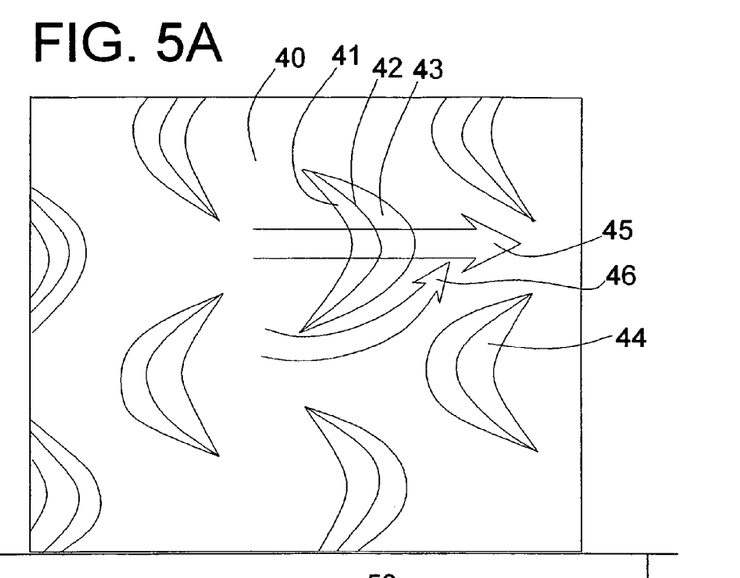
FIG. 5A is an exterior surface view of flow mixing fin shapes. Elements are:
40. Exterior surface troughs
41. Concave surface of dune-fin
42. Ridge crest of dune-fin
43. Convex surface of dune-fin
44. Dune-fin
45. Elevated and separated flow off the dune-fin
46. Descending and replacing flow behind the dune-fin

In FIG. 5A fins that can mix fluid flowing over their surfaces are shown. There are a wide variety of fin structures 41, 42, 43, 44 that could impel flow mixing over the surface 40 of the heat sink. The ability to mold shapes with the dielectric materials permit a wider variety of forms than what is typical of solid metal heat sink fins. Overhanging features and twists are possible with rubber or plastic molding, which is not possible to separate as solid metal components from molds. In this example the fins 43, 44 are shaped similar to sand dune structures (barchans). The sand-dune structures can be positioned relative to each other in a pattern such that the fluid flow 45 from one dune 43 interacts with the adjacent dune flow 46. In this figure the flow 45 will flow up the ramp 41 of the dune and separate from the abrupt upper edge 42 of the dune. Flow 46 that moves down behind the opposite curved adjacent dune 44 impels flow down to the surface and then laterally along the back side of the dune 43 to replace the flow on the back side of the dune. This mixing of flow increases the heat transfer and can induce turbulent flow mixing into the flow before it would occur without these patterns of fins.

Figure 5B:
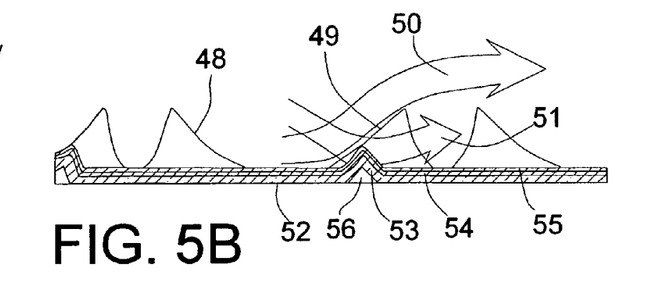

In FIG. 5B side cross-sectional view of the mixing fins is shown. The formation of the mixing fins can be done by molding a figured dielectric layer 53 with the mixing shapes onto the flat back surface 52 of the photovoltaic panel. A particular feature of molding the relief structure is that fin shapes such as the dune fins 48, 49 can be formed. This fin shape is formed to create flow separation and rotation or vortices along with heat transfer, there are a range of possible shapes and descriptions such as pyramids, trapezoids, rectangles, twisted fins, elliptical, dune-like, barchan, and crescent shaped fins. Differential thermal expansion strain relief voids 56 can be formed under the base of the relief structures to locate the strain reliefs where they are most effective and to minimize the amount of dielectric material used.

Suitable materials for the molded dielectric 53 are silicone rubber, metal powder loaded silicone rubber, ceramic powder loaded silicone rubber, and graphite loaded silicone rubber, urethane rubber, EVA polymer, and polyester. In some systems it may be cost effective to use only a dielectric material 53 or a dielectric material loaded with thermal conductors and radiant emissive materials as the only component of the figured heat sink. A thermally conductive layer 54 can be deposited onto the figured dielectric layer 53, such as plasma sprayed aluminum, copper, zinc, and tin. A radiant emissive coating 55 such as carbon black loaded paint is sprayed onto the thermally conductive layer.

The air flow patterns of airflow 50, 51 across the fin surface shows air flow 50 moving up the ramp 49 of the dune-like fin and then separating at the crest of the fin. Air flowing from the adjacent flow 51 comes down and from the side to replace the flow behind the fin 49. This mixing of the flow can increase the convective heat transfer to the fluid flowing past the photovoltaic panel compared to a flat surface. Fluid flow across these fin shapes 48, 49 can also induce rotational vortex flow or turbulence in the fluid flow 50, 51 and thereby increase heat transfer from the photovoltaic cell surface 52.

Figure 6:
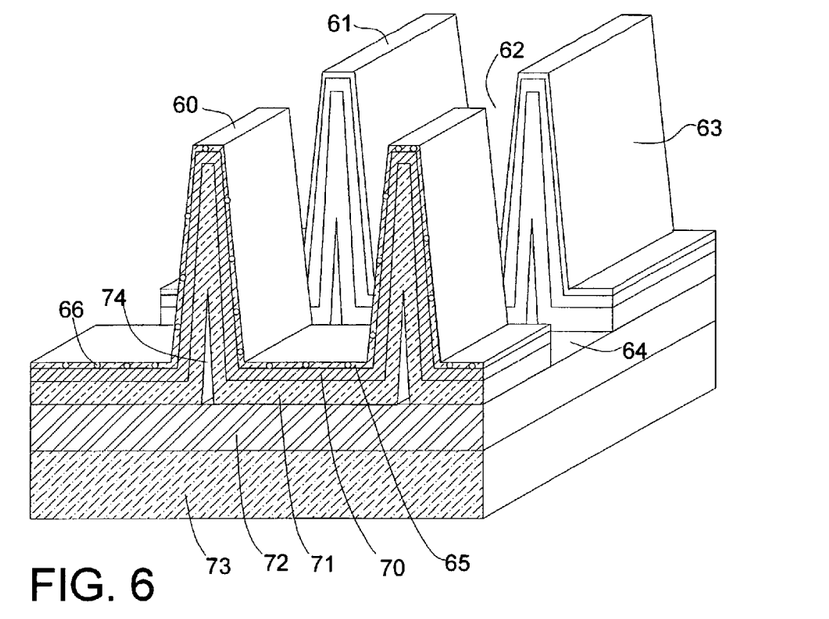
FIG. 6 shows a relief structured dielectric with expansion gaps within fins and between fin array in cross-section and projected view. Elements are:
60. Fin of first array of fins
61. Fin of second array of fins.
62. Air flow gap between fins
63. Fins
64. Gap between heat sink panels
65. Radiant emissive coating
66. Phase change material or voids in radiant emissive layer
70. Thermal conductive coating
71. Relief dielectric material
72. Semiconductor devices
73. Transparent cover or glass cover
74. Expansion gap within the dielectric material and fin

In FIG. 6 the bent metal heat sink is formed with steel or aluminum sheet metal 70 by bending or stamping with stress relief voids 74 in the fins and periodic gaps 64 between heat sinks 60, 61. A polymer 71 such as silicone rubber adhesive is applied to the planar surfaces of the bent metal sheet 70 and then applied with pressure to the planar surface of the photovoltaic cells 72. The silicone rubber adhesive then extrudes and partially flows into the voids of the vertical fin structures 70. Voids 74 can be formed and left inside the fin 63 bases to act as lateral stress relief. This extrusion into voids also permits the rubber adhesive to laterally flow and thin without excessive pressure on the photovoltaic cells 72 and glass cover plate 73 into the planar regions and minimize the thickness of the resulting dielectric layer 71 between the photovoltaic panel 72 and the thermally conductive layer 70. The sheet metal plate heat sinks 60, 61 periodically can have separations between plates 64 to act as thermal stress relief. The periodic separations 64 can also ease in construction of photovoltaic panels.

In this example of the invention the emissive coating can have materials embedded 66 in the radiant emissive coating 65 that give it a high emissivity in the infrared and can also be a phase change material such as water to cool the surface of the fins 63. Water has strong emission bands in the infrared, thus emitting better in the infrared. By absorbing water the materials can evaporate the water when the fins 63 become hot and absorb heat energy cooling the panel. This can further lower the maximum temperature rise that the photovoltaic panel can experience in a day cycle. A cycle of operation is that the water absorbing film on the back side of the heat radiator can absorb water during the night such as dew condensing of this radiantly cooled surface. Then in the daytime as the panel heats it releases the heat into the phase change of the melting and evaporating water into the flowing air between the fins 62. Other types of phase change materials 66 are possible such as solid-liquid waxes, and hydrating salts. The incorporation of the water losing materials into the radiant emissive layer also will form voids 66 in the coating when dry, which can provide thermal stress relief voids in the emissive layer and increase the heat transfer surface area. The panels could be incorporated into air heating systems or thermal energy storage systems.

Figure 7:
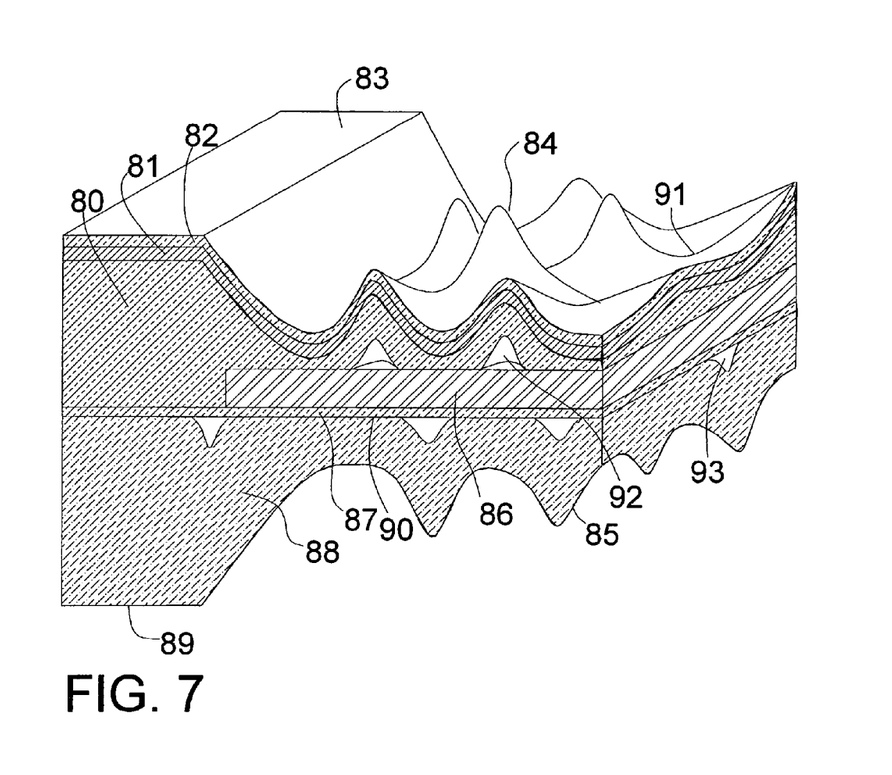
FIG. 7 is a side cross-sectional view of thickened perimeter structured front and back dielectric layers with polymorphic fin features and thinned center. Elements are:
80. Figured dielectric backing layer
81. Thermally conductive layer
82. Radiant emissive layer
83. Thickened backing plate
84. Polymorphic fin
85. Polymorphic fin on transparent front dielectric
86. Semiconductor device or photovoltaic cell
87. Semiconductor mounting adhesive
88. Figured dielectric front plate
89. Thickened perimeter of cover plate 90. Planar surface of the glass plate
91. Dips in the polymorphic surface
92. Strain relief void in the dielectric layer
93. Void between dielectric front layer and mounting adhesive

In FIG. 7 a side cross-sectional view of a panel formed with thickened perimeter structured front and back dielectric layers in shown. In this example of the invention the front surface is a molded sheet of glass 88 with polymorphic relief features 85 formed on the front surface and the back side facing the photovoltaic cells is planar 90. A thickened perimeter 89 to act as a structural frame is molded into the cover glass sheet. Many possible surface shapes of the front cover 88 could be used to optimize the light capture to the cells and improve the conduction and convective heat transfer from the cover glass 88 and front surface 85, including concentrating lenses. The relief structure 85 of the cover glass can improve the structural integrity of the cover glass by being a more elastic structure, blocking crack propagation, and allowing a thinner more heat conductive cover glass. The photovoltaic cells and circuits are mounted with an adhesive 87 such as Sylgard 184 to the flat surface of the front glass sheet. On the back side of the semiconductor cells 86 a silicone rubber sealant monomer layer 80 is applied to a polymorphic shaped aluminum or steel sheet metal backing 81 in a pattern and pressed onto the semiconductor cells 86 and front plate 88. In this pressing, voids 92 under the peaks 84 in the sheet metal are formed as the sealant extrudes and thins under the valley regions of the sheet metal 91. These voids 92 help to allow the adhesive 80 to thin under the sheet metal valleys 91 for higher thermal conduction and provide differential thermal expansion strain relief between the sheet metal 81 and the semiconductor cells 86. By placing the voids 92 within or under the peaks or fins 84, the loss of thermal conduction is minimized by having a void 92, which has a low thermal conductivity compared to the dielectric 80, under the peaks 84, where the thermal gradient and conduction will be lowest due to thickness. The invention strategically minimizes the overall conductivity loss to the system. The lateral conduction of heat through the metal layer 81 from the thin regions 91 to the peaks 84 is the dominate heat conduction route. Thus, by keeping the thin regions 91 as thin as possible and using a stress relief with the void 92 rather then a uniform thicker dielectric layer the net heat conduction is increased, and less material is used. The silicone rubber monomer 80 is cured while clamped. At the perimeter 83 of the polymorphic sheet metal 81 a thicker perimeter cavity is formed in the sheet metal, and the subsequent extrusion of silicone rubber monomer fills the perimeter region 80 forming a thicker perimeter 83. On the outer surface of the polymorphic sheet 84, 91, 83 a carbon black loaded paint 82 is sprayed onto the sheet metal 81 and dried.

In operation light photons travel through the dielectric glass cover 88 and transparent adhesive 87 and are absorbed in the photovoltaic cells 86. Part of the absorbed photons convert to electrical output of the cell and the remainder is converted to heat. The temperature rise of the photovoltaic cell 86 and subsequent temperature gradient to the front 85 and back surfaces 84, 91 of the panel drives heat through the front and back panels. In the front panel the heat conducts through the transparent adhesive 87, though the cover glass 88, and to the surface of the polymorphic glass surface 85. Convective heat transfer and radiant heat transfer occurs from the surface of the polymorphic glass 85 to the air and surrounding surfaces. The polymorphic surface features 85 can be chosen to improve the convective heat transfer and provide light transmission to the photovoltaic cells. The surface texturing 85 can in some situations improve the light capture of the photovoltaic cells. The surface texture 85 can be concentrating lens or perform light trapping. Voids 93 can be formed between the cover glass between the interface to the transparent adhesive to act as thermal expansion strain relief between the adhesive 87 and the photovoltaic cells 86. These voids 93 can also act as light reflectors and be placed with respect to the photovoltaic cells 86 to concentrate light onto the photovoltaic cells 86. The voids 93 can act as gas removal routes or collection sites during the lamination photovoltaic cells 86 to the cover glass 88. On the back side of the photovoltaic cells the thermal gradient to the outer surface drives heat conduction though the silicone rubber 80 and out to the metal polymorphic layer 81. The thinner regions of the silicone rubber 91 will conduct more heat to the metal layer 81, and heat will travel laterally though the fin surfaces 84 to spread over the polymorphic surface. The heat will then conduct into the radiant emissive layer 82 and radiate and convect to the surrounding surfaces and air. Air flow over the polymorphic surfaces 84, 91 is expected to become turbulent at a lower velocity than for a smooth surface, so, the effective convective heat transfer coefficient for these surfaces is expected to be much higher. The polymorphic surfaces 84, 91 such as a honeycomb ridges or random bumps and dips, will not have a straight line on its surface in any direction and has the property that it is more elastic. The polymorphic surfaces 84, 91 strengthen the panel by not permitting cracks to propagate in straight lines across its surface. On the perimeter of the panel the thickened rim 83, 89 will give the panel structural strength and allow for frameless mounting of the photovoltaic panel. The thickened perimeter 83, 89 also permits the inner region 84, 85, 91 of the panel to be thinned without losing necessary strength, and thereby increase the rate of heat transfer, and keep the photovoltaic cells 86 cooler. Cooler photovoltaic cells 86 achieve a better power performance.

The invention provides heat removing layer for planar mounting to photovoltaic, semiconductor and electrical devices. A dielectric material has a flat surface on the front of layer facing the device, and relief structures formed on the back of layer facing away from the device. Voids are formed within same dielectric material or between layers on the same dielectric material.

Essential Feature Elements

1. Heat removing plate placed on front and/or back of planar non-concentrating planar photovoltaic cells, or semiconductor electrical devices.

2. Photovoltaic heat removing plate formed with a dielectric material.

3. Relief structures formed with the dielectric or thermally conductive materials on back side.

4. Voids are formed within the dielectric materials, thermal conduction layers, and emissive layers to relief thermal expansion stress 5. Voids and relief structures in the dielectric can function as light refractors or reflectors to channel light or act as light conduits to the photovoltaic cells.

6. The relief structures redirect sheer stress from differential thermal expansion.

7. Metallic or thermally conductive coatings on the relief structured dielectric material.

8. Radiant emissive coating on back side of backing plate.

9. Can use tinted and non-transparent glass for the dielectric material

10. Dielectric material laminated with metals

11. Coating on metals

12. Black emissive coating on back side

13. Emissive coating on back side can have high infrared emissisivity and low visible light emissivity, such as titanium dioxide.

14. Relief structures make the glass stronger and stiffer.

15. Can be plastic dielectric

16. Relief features can be formed in multiple patterns to maximize heat transfer: bumps, ridges, rods, cones, interconnected ridges, honeycomb, hexagonal patterns, turning bumps, irregular features, asymmetric features, sand-dune shaped features, and curl, or flow rotation inducing flow features.

17. Folds, breaks and convolutions in metal layer to absorb differential expansion.

18. Elastic glues between layers.

19. Photovoltatic cell can be mounted or printed onto the backing substrate.

20. Electrical circuits can be mounted or printed onto the backing substrate.

21. The backing substrate can have a thickened rim to act as stiff frame or margin of the panel.

22. The coating on the back side of the plate is water absorbing

23. The coating on the back side of the plate used the water absorption to cool the plate by, phase change and/or evaporation and the radiant emissivity of the water absorbed in the film.

24. The relief dielectric surface can be on the light receiving side.

A heat removing layer for planar mounting to semiconductor electrical devices 16 formed with a dielectric material flat on the front of layer, and relief structures formed on the back side of layer and voids formed within same dielectric material or between other layers on the dielectric material.

While the invention has been described with reference to specific embodiments, modifications, and variations of the invention may be constructed without departing from the scope of the invention, which is defined in the following claims.

I claim:

1. Apparatus comprising a heat removing layer for planar mounting to semiconductor electrical device, wherein the heat removing layer is a dielectric material, the dielectric material being largely planar to the plane of the semiconductor device on a front side of the dielectric material facing the semiconductor device, a plurality of dielectric relief structures formed in the dielectric material on a back side facing away from the semiconductor device that protrude into fluid flow are largely non-planar to the plane of the semiconductor device, wherein the dielectric relief structures taper away in thickness as the dielectric relief structures protrude into fluid flow, at least one other layer mounted on the back of the dielectric material, and a plurality of voids within the dielectric material or between the semiconductor electrical device and the dielectric material or between the dielectric material and the at least one other layer formed on the back of the dielectric material.

2. The apparatus of claim 1, wherein the at least one other layer is a thermal conductive layer on the plural dielectric relief structures, and a radiant emissive coating on the thermal conductive layer on the dielectric relief structures.

3. The apparatus of claim 1, wherein a dielectric material has with a similar coefficient of thermal expansion to the semiconductor electrical devices.

4. The apparatus of claim 2, wherein the thermal conductive layer has a dissimilar coefficient of thermal expansion to the dielectric material and wherein the voids are between the thermal conductive layer and the dielectric material layer.

5. The apparatus of claim 4, wherein the voids are located in proximity to the back side of each relief structure to relieve differential thermal expansion stress.

6. The apparatus of claim 4, wherein the thermal conductive layer has bends and voids at bases of the relief structures to relieve differential thermal expansion stress.

7. The apparatus of claim 4, wherein the semiconductor electrical device is a photovoltaic cell, thermoelectric cell, light emitting diode, electrical switching diode, transistor, or integrated circuit.

8. The apparatus of claim 1, wherein the relief structure is formed by extruding, rolling, stamping, laminating, molding a suspension or powder, painting, printing, bonding, gluing the dielectric material.

9. The apparatus of claim 2, wherein the dielectric material forms a relief structure with voids by partially extruding into cavities, or forming bubbles into the dielectric material into the thermal conductive layer.

10. The apparatus of claim 2, wherein, thermal conductive layer further comprises metal structures formed by painting, welding, bonding, gluing, electroplating, bending, plasma spraying, laminating, or attaching metal structures or other thermally conductive structures of plates, foils, films, granules, hairs, fins, polymorphic structures, or rods.

11. The apparatus of claim 1, wherein the relief structures in the dielectric material have shapes of bumps, lenses, rods, cones, rectangles, pyramids, ridges, segmented ridges, segmented patterns, hairs, pedestals, networks of ridges, fins, curved fins, asymmetric features, polymorphic structures, crescents, ellipses, barchans, and sand-dune like shapes.

12. The apparatus of claim 1, wherein the relief structures act to create, mixing or vortex flow in flow passing across surfaces of the relief structures.

13. The apparatus of claim 2, wherein the radiant emissive coating is formed with a deposit, paint or surface modification.

14. The apparatus of claim 2, wherein the radiant emissive coating has a high emissivity in infrared and low absorption in visible light spectrum.

15. The apparatus of claim 2, wherein the radiant emissive coating contains carbon black, titanium dioxide, voids, water absorbing compounds, clays, zeolite, silica gel, or a phase change material.

16. The apparatus of claim 2, wherein the thermal conductive and/or radiant emissive coating has discontinuities or periodic surface folds.

17. The apparatus of claim 1, wherein the dielectric material is thicker near a perimeter of the layer to for structural strength.

18. Apparatus comprising a heat removing layer for planar mounting to semiconductor electrical device, wherein the heat removing layer is a dielectric material, the dielectric material being largely planar to the plane of the semiconductor device on a front side of the dielectric material facing the semiconductor device, a plurality of dielectric relief structures formed in the dielectric material on a back side facing away from the semiconductor device, at least one other layer mounted on the back of the dielectric material, and a plurality of voids within the dielectric material and between the semiconductor electrical device and the dielectric material, or between the dielectric material and the at least one other layer formed on the back of the dielectric material, wherein the dielectric material is not transparent to visible light and is reflective, scatters, scintillates, or phosphorescent or absorptive.

19. The apparatus of claim 1, wherein in the dielectric material is transparent to visible light.

20. The apparatus of claim 1, wherein the dielectric material is transparent to light and is a conduit of light to photovoltaic cells.

21. The apparatus of claim 2, wherein the thermal conductive layer is transparent to visible light.

22. The apparatus of claim 2, wherein the radiant emissive coating is reflective and/or transparent to visible light.

23. The apparatus of claim 1, wherein the dielectric material layer that forms the flat front and back relief structures is made of glass, plastic, ceramics, glass fiber reinforced polymer, metal oxide impregnated polymer, alumina powder impregnated polymer, graphite impregnated polymer, metal impregnated polymer, silicone rubber, butyl rubber, urethane polymer, or ethylene vinyl acetate, the radiant emissive coating is made of carbon black loaded polymers, aluminum oxide anodized layer, titanium dioxide, titanium dioxide loaded polymers, glass encapsulated titanium dioxide, zeolite, acrylic hydro gel, sodium sulfate hydrate encapsulated in silicone rubber, waxes, polymers, or sodium sulfate hydrate encapsulated in urethane polymer, or sodium sulfate encapsulated in silicone rubber.

24. The apparatus of claim 2, wherein the thermal conductive layer on the dielectric material is made of silver, copper, aluminum, iron, tin, brass, zinc, aluminum oxide, silicon carbide, zirconium, graphite, carbon fibers, metal powder loaded polymers, or metal oxide loaded polymers.

25. The apparatus of claim 2, wherein the radiant emissive coating is made of carbon black loaded polymers, aluminum oxide anodized layer, titanium dioxide, titanium dioxide loaded polymers, glass encapsulated titanium dioxide, zeolite, acrylic hydro gel, sodium sulfate hydrate encapsulated in silicone rubber, waxes, polymers, or sodium sulfate hydrate encapsulated in urethane polymer, or sodium sulfate encapsulated in silicone rubber.

* * * * *